Figure 1:
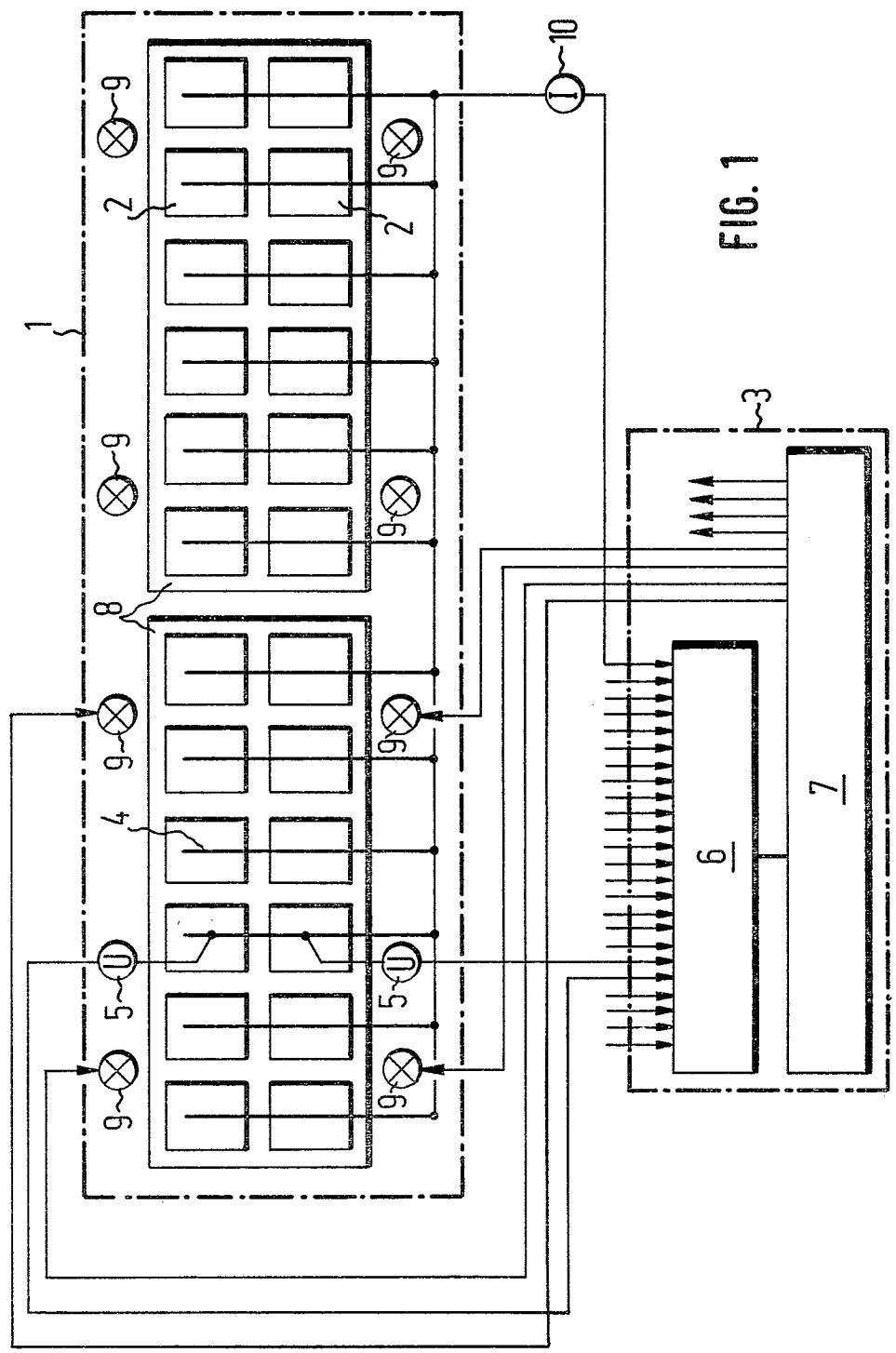

United States Patent [19]

Bergner et al.

[11] 4,244,801

[45] Jan. 13, 1981

[54] APPARATUS TO MEASURE THE DISTRIBUTION OF THE ANODE CURRENTS IN CELLS FOR ALKALI METAL CHLORIDE

[75] Inventors: Dieter Bergner; Winfried Hofmann, both of Kelkheim; Helmut Hund, Königstein; Lothar Pelz, Rödermark; Gerhard Quietzsch, Bad Soden am Taunus, all of Fed. Rep. of Germany

[73] Assignee: Hoechst Aktiengesellschaft, Frankfurt am Main, Fed. Rep. of Germany

[21] Appl. No.: 57,434

[22] Filed: Jul. 13, 1979

Related U.S. Application Data

[63] Continuation of Ser. No. 905,004, May 11, 1978, abandoned.

[30] Foreign Application Priority Data

May 14, 1977 [DE] Fed. Rep. of Germany ....... 2721957

[51] Int. Cl.³ .......................... C25B 1/16; C25B 1/26; C25B 15/04
[52] U.S. Cl. ..................................... 204/225; 204/99; 204/128
[58] Field of Search ............. 204/225, 99, 128

[56] References Cited

U.S. PATENT DOCUMENTS

| 2,930,746 | 3/1960 | Cooper | 204/225 |
| 3,329,592 | 7/1967 | Uhrenholdt | 204/225 X |
| 3,900,373 | 8/1975 | Ralston | 204/99 |
| 3,926,750 | 12/1975 | Adachi et al. | 204/99 |
| 4,008,142 | 2/1977 | Doring et al. | 204/225 |
| 4,067,793 | 1/1978 | Piras et al. | 204/225 X |
| 4,082,639 | 4/1978 | Ralston et al. | 204/225 X |

FOREIGN PATENT DOCUMENTS

| 2352372 | 4/1975 | Fed. Rep. of Germany | 204/225 |
| 7309925 | 1/1974 | Netherlands | 204/225 |
| 7702610 | 9/1977 | Netherlands | 204/225 |
| 1212488 | 11/1970 | United Kingdom | 204/225 |
| 1466602 | 3/1977 | United Kingdom | 204/225 |

*Primary Examiner*—G. L. Kaplan
*Attorney, Agent, or Firm*—Curtis, Morris & Safford

[57] ABSTRACT

For the indirect measurement of the distribution of the anode currents in electrolytic cells operated with alkali metal chloride according to the amalgam process the cell voltage is determined without unnecessary ohmic connections between the current carrying elements of the cells and other conductive elements thereof.

3 Claims, 3 Drawing Figures

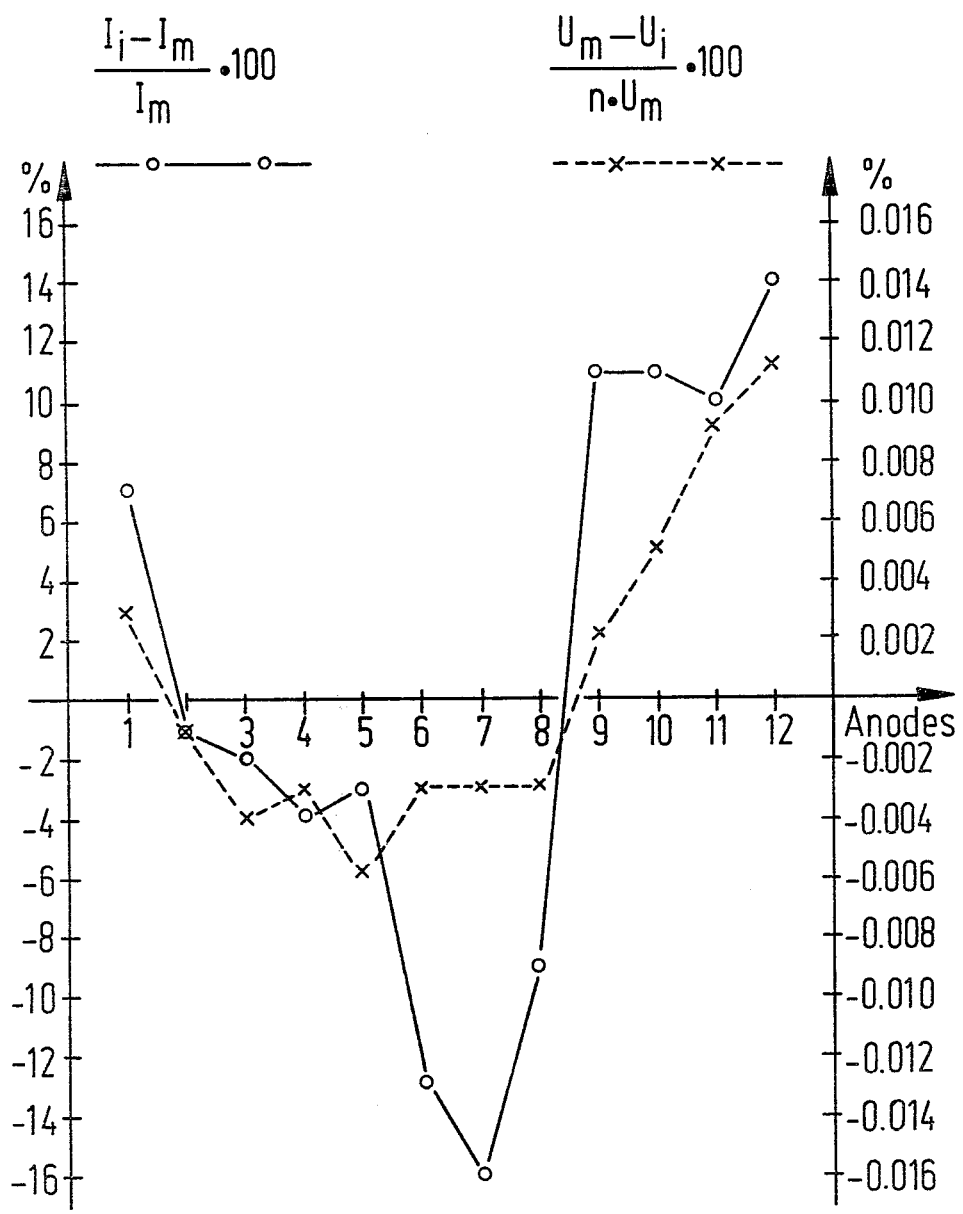

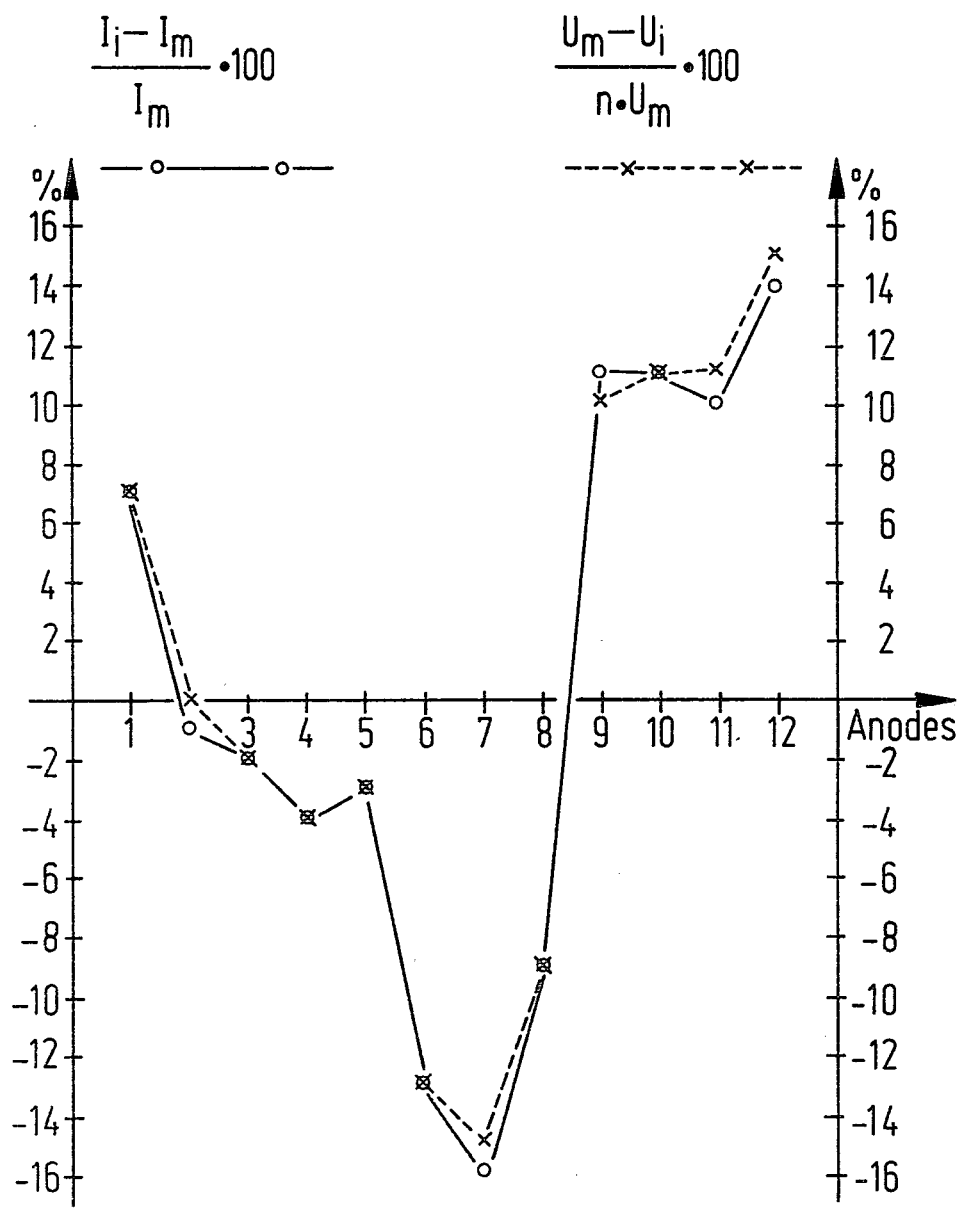

APPARATUS TO MEASURE THE DISTRIBUTION OF THE ANODE CURRENTS IN CELLS FOR ALKALI METAL CHLORIDE

This is a continuation of application Ser. No. 905,004, filed May 11, 1978, and now abandoned.

This invention relates to a process for the indirect measurement of the distribution of the anode currents in electrolytic cells operated according to the amalgam process with alkali metal chlorides.

In the operation of electrolysis cells using alkali metal chlorides the distribution of the anode currents is of particular interest. German Offenlegungsschrift No. 2,352,372 describes a process for measuring the distribution of the anode currents in electrolytic cells. In this process the voltage drop in the current lead system, that means in the stems of the anodes or in the so-called bus bars, mechanically and electrically connecting a plurality of anodes, is measured with temperature compensation. A mean value is calculated by summing up all the currents in the leads measured in this manner and by dividing the value obtained by the number of such individual currents. The individual currents are each compared with the mean value obtained and their respective deviations are recorded. As soon as the deviation of any individual current exceeds a given value, an alarm is set off or the distance of all anodes from the cathode (i.e., the gap between them) is enlarged by a determined distance.

This process has the disadvantage that a temperature compensation is necessary, that the voltage drop, which amounts to a few millivolts only, must be amplified and that the current distribution established in this manner gives evidence only of the load (that is, the current flow) of the anodes or anode groups and says nothing about the anode-cathode distance. Thus, the danger of a short-circuit cannot be perceived with certainty. A further disadvantage of the known process resides in the fact that the current distribution can only be measured in the direction of flow of the mercury cathode and that a measurement of the current distribution transverse to the direction of flow is not possible.

Such transverse current distribution measurements are important because the anode-cathode gap in this transverse direction may be different. Furthermore, in general, the anode bus extends transversely of the cathode current flow direction, and plural anodes are connected to this bus. The anode current to the first anode may differ from that to the last anode. These individual current distributions should be controlled so that equal anode currents are supplied. But the known process merely provides a total anode bus current measurement and not individual anode current measurements.

It is, therefore, the object of the present invention to provide a process for measuring the distribution of the anode currents, wherein a temperature compensation is not necessary, the electrical values to be measured are sufficiently high that they need not be amplified, the resultant measurement is a direct function of the anode-cathode distance and, in the case of metal anodes if the current and the anode-cathode gap of a cell are constant, a measured voltage provides an indication of the anode activity i.e., the electrical resistance between the anode material and the electrolyte.

This objective is achieved by a process for indirectly measuring the distribution of the anode currents in electrolytic cells operated with alkali metal chloride according to the amalgam process, which comprises determining the distribution of the anode currents by measuring the cell voltages between the stems of the anodes and the mercury cathode without providing ohmic connections between the current carrying conductors and other electrically conductive elements of the cell, so that current is supplied to the anodes via current buses only.

The term anode is intended to include individual anodes as well as several anodes (anode assemblies) which are connected mechanically and electrically by so-called bus bars and/or anode groups consisting of a plurality of anode assemblies.

By the process of the invention it is possible to measure the distribution of the anode current in the direction of flow of the mercury cathode as well as in transverse direction thereto. When, for example, the cell voltage at each side of the electrolytic cell is measured by, for example, connecting voltmeters between the stems of the anodes (first and last) and the cathode it is possible to detect a diverging or different anode-cathode distance (or gap) transverse to the mercury flow direction of the mercury cathode as a result of the differences in the measured voltages. This is because different anode-cathode gaps in the transverse direction result in correspondingly different voltages. The determination of the voltage distribution in combination with a single measurement of the current of the total cell can be used to calculate the current flowing through the anodes.

The process of the invention will now be described by way of example with reference to the drawing of which FIG. 1 represents a top view of a cell for alkali metal chloride electrolysis with a microcomputer connected thereto;

FIG. 2 is a comparison between the current and voltage distribution when measuring the voltage distribution in a cell by providing ohmic connections between the current carrying conductors and other conductive elements of the cell according to the state of the art, and FIG. 3 is a comparison between the current and voltagle distribution when measuring the voltage distribution according to the process of the invention.

The cell for brine electrolysis 1 comprises, for example, twelve bus bars 4 each with two anodes 2 and a common cathode positioned beneath and spaced from the illustrated anodes. The electrolytic cell is connected with a measuring and controlling microcomputer 3. On either side of the electrolytic cell the voltages are tapped with a voltmeter 5 between the bus bars 4 and the cathode and measured cyclically in the key station 6 of computer 3. In the processing station 7 of microcomputer 3 the distribution of voltage is determined in longitudinal and transverse directions with respect to the mercury flow from the individual measured voltage values and a mean value of voltage distribution is calculated. The individual voltages are compared with the mean value obtained. In the case of deviations beyond a predetermined value, the distance of the anodes 2 or of the anode assembly 8 from the cathode is adjusted by actuating the regulating elements 9 until the uniform distribution of the voltage is within the admissible deviation limits. The current load of each anode can be calculated by measuring the total current with ammeter 10 and by using the measured distribution of voltage.

In FIGS. 2 and 3 the anodes $i = 1 \ldots 12$ are plotted on the abscissa in the direction of flow of the mercury, the current distribution in percent is plotted on the lefthand ordinate while the distribution of voltage in percent is plotted on the right-hand ordinate. In FIG. 3 it can be seen that when the cell voltages are measured in accordance with the invention the curve of the current distribution coincides with the curve of the voltage distribution. When measuring the cell voltages in a cell wherein current flows through other elements to or from the anodes, that is, where there are ohmic connections between the anode bus bars and other current conductors on the one hand, and conductive elements of the cell on the other, the two curves considerably differ from each other as can be gathered from FIG. 2. In the FIGS. the index i characterizes the anode (1, 2, ...), m is the index for the mean value and n indicates the number of anodes.

The special advantage of the process of the invention resides in the fact that the mean value of the individual voltages of the measured distribution of voltage can be used to regulate the cell voltage.

What is claimed is:

1. A system for controlling alkali metal chloride electrolysis apparatus operated according to the amalgam process, said apparatus including a number of cells each having an anode spaced from a common cathode, said system comprising a plurality of bus bars, each connected to at least one anode to supply current thereto; a plurality of voltmeters, each connected between a respective anode and said common cathode of a cell for providing measurements of the voltages across respective ones of said anodes and said common cathode for said cells; an ammeter connected in common to all of said cells for providing a measurement of the total anode current through all of said cells; means for obtaining respective measurements of the anode current through each cell on the basis of the voltage measured for that cell and the measured total anode current; distance changing means for changing the distance between respective ones of said anodes and said common cathode; and process control means for operating said distance changing means if respective ones of the measured anode currents and cell voltages exceed predetermined limits.

2. The system of claim 1 wherein each voltage measurement is directly related to the current flowing between a respective anode and said common cathode.

3. The system of claim 1 wherein each voltage measurement is directly related to the activity of a respective anode.